United States Patent [19]

Fales

[11] 3,959,104
[45] May 25, 1976

[54] ELECTRODE STRUCTURE FOR GENERATING ELECTRICAL DISCHARGE PLASMA

[75] Inventor: John D. Fales, Huntington Station, N.Y.

[73] Assignee: Surface Activation Corporation, Westbury, N.Y.

[22] Filed: Sept. 30, 1974

[21] Appl. No.: 510,692

[52] U.S. Cl. ............................. 204/164; 204/165; 204/168; 250/531
[51] Int. Cl.² ...................... B01K 1/00; C07C 3/24
[58] Field of Search ............... 204/164, 165, 168; 250/531, 542

[56] References Cited
UNITED STATES PATENTS

| 3,057,792 | 10/1962 | Fröhlich | 204/165 |
| 3,376,208 | 4/1968 | Wood | 204/168 |
| 3,870,610 | 3/1975 | Baird et al. | 204/165 |

Primary Examiner—John H. Mack
Assistant Examiner—Aaron Weisstuch

[57] ABSTRACT

An electrical plasma discharge is established between adjacent tubular electrodes of an electrode structure having a stacked array of rows of tubular electrodes of opposite polarity row-by-row. A substrate is moved through the electrode structure along several paths of travel such that the electrical plasma discharge is substantially parallel to one or both surfaces of the moving substrate. During the electrical discharge, the electrodes are cooled by flowing coolant therethrough.

9 Claims, 13 Drawing Figures

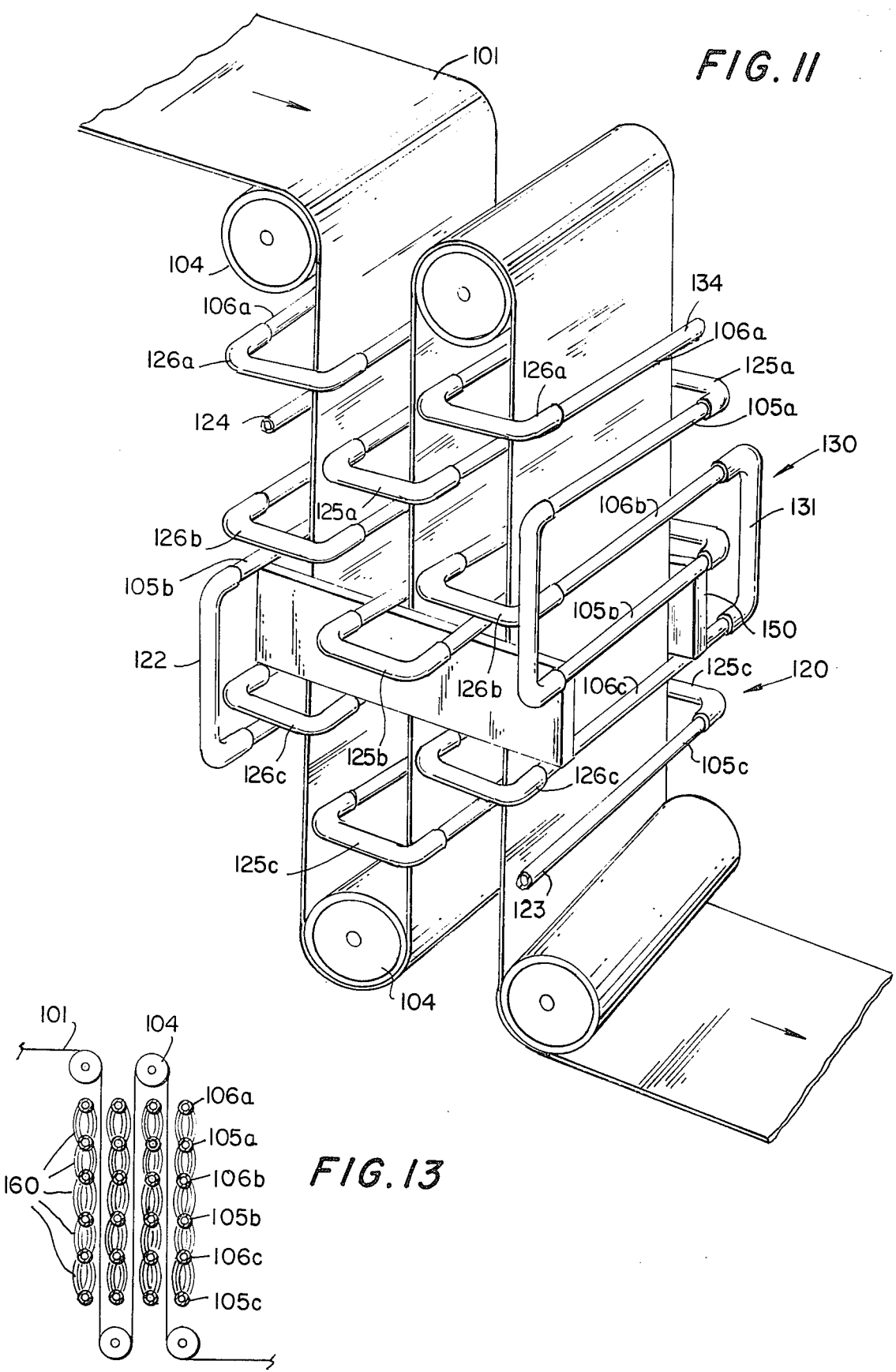

ELECTRODE STRUCTURE FOR GENERATING ELECTRICAL DISCHARGE PLASMA

The present invention relates to a method and apparatus for treating a substrate with an electrical discharge plasma.

The treatment of a substrate with an electrical discharge plasma has been extensively discussed in the literature. See, e.g. "Prospects for Industrial Applications of Electrical Discharge", Bradley and Fales, *Chemical Technology*, Vol. 1, April 1971, pages 232–237. The patent literature has several proposals for such treatment, among which there may be mentioned:

1. Polyethylene becomes printable when exposed to a plasma generated by corona discharge in air. U.S. Pat. No. 3,018,189;
2. Polyvinylchloride develops a cross-linked skin which inhibits plasticizer loss when treated in an argon plasma. U.S. Pat. No. 3,687,832;
3. Oriented polypropylene pre-irradiated with high energy radiation becomes heat-sealable when subsequently treated with a corona discharge in air. U.S. Pat. No. 3,171,539;
4. Textiles and films become graftable with vinyl monomers after treatment with a "spark" discharge in argon or other gases. U.S. Pat. No. 3,600,122;
5. Functional groups may be added to polymer surfaces by exposure by blowing products from an RF electrodeless discharge in a reactive gas against the polymer surface;
6. Films may be treated for increased adhesion by a high frequency glow discharge in organic vapors. U.S. Pat. No. 3,761,299.

Even when achieving commercial use, nevertheless the prior electrical discharge plasma systems have been subject to instabilities that seriously deleteriously affected their use for the treatment of thermally sensitive substrates, and that often resulted in destructive effects upon the electrodes. When efforts were made to increase the current flow beyond certain limits, locally high current densities (amperes/cm$^2$ of electrode surface) developed into arcs or sparks which passed through and were destructive to the substrate (local overtreatment), which could damage the electrodes themselves (pitting or puncture).

Thus, despite the many proposals for treating a substrate with electrical discharge plasma, there is nevertheless a definite need in the art for an economical and efficient apparatus for activating a substrate by treatment of the substrate with electrical discharge plasma.

It is thus an object of the invention to provide apparatus for economical and efficient activation of a substrate by treatment of the substrate with electrical discharge plasma.

This is accomplished by the present invention by the provision of a method and apparatus for establishing a zone of electrical discharge plasma, exposing an article to said plasma in said zone, and confining the flow of plasma current to a path substantially parallel to at least one major surface of the article, said path being transverse to at most only a minor amount of the surface area of the object.

The substrate to be treated can be widely varied in form, structure, and composition. Thus, the substrate to be treated may be organic and/or inorganic, natural and/or synthetic materials, such as optical lenses, natural and synthetic textile material, cellulosic polymers, glass, asbestos, thermoplastic or thermosetting polymers, etc. To some extent the classifications set forth above overlap; to generalize, any material affected by discharge plasma may be treated with the apparatus of the invention.

The form of the substrate is not critical. For example, optical lenses, mono-filaments, yarns made of staple, multifilaments and mono-filaments, film, sheets, webs, mats, fabrics are suitable for use in the invention. In some cases, the material to be treated may be adhered to a carrier and then removed from the carrier after treatment.

The term "plasma" as used herein means a gas, partially dissociated electrically into approximately equal charge densities of positive and negative ions (usually electrons) along with resulting chemically or physically active species, such as atoms or energetically excited atoms, free radicals or energetically excited free-radicals, molecules or energetically excited molecules, etc. Since the substrates to be treated may include organic materials which are thermally sensitive, the thermal properties of the plasma must be such that no macroscopic regions of the substrate will exceed the thermal degradation or melting temperature of the material.

Two practical types of plasmas having the desired thermal properties are known: (1) the hybrid plasma, exemplified by the atmospheric pressure corona and the ozonizer discharge; and (2) the low pressure glow discharge, exemplified by the glowing gas of the familiar neon sign and fluorescent lighting tube, and also be the low pressure discharge generated by high frequency electrodeless plasma generators.

The hybrid plasma produced by the corona and ozonizer consists of many tiny sparks which travel in random fashion over the electrode surfaces. Although the local temperature in the sparks is high enough to thermally degrade organic substrates contacted by the plasma, the rapid travel of the hot sparks coupled with dilution by a great excess of cold gas and by rapid travel of the substrate reduces the heat transfer to any macroscopic region of an organic substrate in contact with the hybrid plasma to the point where gross thermal degradation does not occur.

While both forms of plasma may be used, the low pressure glow discharge is to be preferred, since it consists of a truly uniform dispersion, on a molecular level, of glowing electrical discharge plasma in undissociated gas. The discharge medium may be considered to be at only a few tens of degrees above ambient temperature, and hence there is no gross thermal degradation of an organic substrate contacted by this plasma.

The rate of treatment of the surface of a substrate in contact with a plasma is an increasing function of the plasma density. Thus, for highest speeds of treatment, the highest permissible plasma density is desired. In turn, plasma density is an increasing function of the electric current density flowing through the dissociated gas. Therefore, for highest speed of treatment, the highest permissible current density at the surface of the substrate is desired.

Although it is a straightforward problem, based on the principles of plasma physics, to establish known and controllable current densities at the surfaces of the electrodes which generate a plasma, or in the case of so-called electrodeless discharges, to establish regions of known and controllable current densities, certain difficulties develop in the presence of substrates which are to be treated by a plasma. For example, when a fabric is treated with electrical discharge plasma by known techniques, the flow of plasma current is transverse to the fabric. Since the filaments of the fabric are dielectrics, most of the current flows through the holes in the fabric and the current density in the holes is higher than at the electrodes. Furthermore, when treating a thick plastic sheet by this known technique, the current lines tend to go around the edges of the sheet, and hence the current density at the edges of the sheet is much larger than near the center.

This concentration of the current density at holes (in the case of fabric) and at the edges (in the case of a sheet) results in a higher rate of plasma treatment in these regions. Furthermore, in the case of fabric, regions of high current density in the holes may lead to fabric destruction, by melting or charring, under conditions where the average current density of the plasma is so low that only slow treatment of most of the fabric can be achieved. High current density in the holes frequently leads to the formation of destructive arcs or sparks due to plasma instabilities.

In the case of continuous treatment of moving fabric webs, the rate of treatment has been found to be severely limited because of the hole effects.

The use of alternating currents of high frequency tends to minimize these effects, since dielectric displacement current develops — the dielectric becomes a "conductor" and behaves as a virtual electrode, the "conductivity" being proportional to the frequency of the applied electric field. Also with high frequency currents the end effects may be minimized by suitable masking of the end region with thick dielectric barriers, thus forcing essentially all of the current to pass through the plastic being treated. In order to achieve the high current densities desired for fast treatment, very high frequencies and/or voltages must be applied.

When it is desired to treat a plastic object of non-uniform cross-section with plasma, for example a lens, non-uniform current densities result, even with masking and high frequency fields.

Early investigations in the field of plasma treatment of substrates were apparently influenced by the mistaken notion that there was an advantage to be achieved by passing the electric current of the plasma through the substrate being treated. This thinking was probably influenced by the correct notion that the density of active plasmas species is greatest where the current of the plasma is greatest.

Later investigators proposed systems where active species produced in the discharge plasma are blown out of the region of current flow by means of a stream of discharge gas. Although an advantage of these systems is that no current flow problems through the substrates exist, the concentration of active plasma species available for surface treatment is ordinarily far less than the concentration in the region of current flow. Since the active species are produced in the region of current flow, where their concentration is maximum, and decay rapidly with time, much more energy must be expended in the discharge to achieve a given degree of surface treatment downstream from the current flow region.

The present invention is based on the principle that a high density of active plasma species can be obtained near the surface of a substrate by passing the plasma current essentially parallel to a major surface of the substrate. By means of this technique it is possible to obtain uniform treatment of the substrate surface with a high plasma current.

The present invention is illustrated by the accompanying drawings, in which

FIG. 11 is a perspective view of the electrical discharge plasma apparatus with parts removed.

FIG. 13 is a schematic representation of the plasma generated by the electrode structure of the invention.

Figure 1:
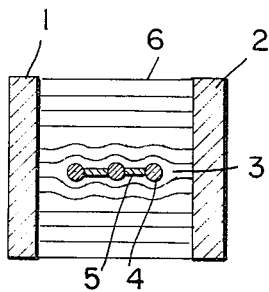
FIGS. 1 to 3 are schematic views in section of embodiments of the invention.

Referring to FIG. 1, an electrical discharge plasma is generated between electrodes 1 and 2 of opposite polarity and bathes both sides of a woven monofilament substrate 3, having warp threads 4 and woof threads 5. The lines of constant plasma current 6 are essentially parallel to the exposed surface of the substrate 3 and uniformly high current density plasma bathes the exposed surfaces of the substrate. Active species, generated close to each surface of the substrate, diffuse rapidly to the surface and into the interstices of the fabric between the warp 4 and woof 5 because of the concentration gradient established between the current flow and zero current flow regions. A sheet of plastic film will behave in similar fashion to the textile substrate 3. In a preferred embodiment, the substrate 3 is pulled through the plasma by rollers (not shown).

Figure 2:
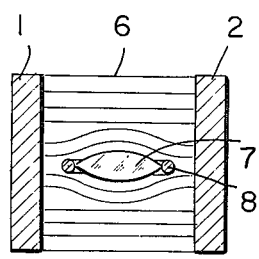

FIG. 2 shows an arrangement for treatment of a solid object, in this case a plastic lens 7. By having a relatively large volume of plasma surrounding the lens 7, there is only a minor distortion of the current density of the plasma, and hence essentially uniform surface treatment can be obtained. Lens 7 is supported between electrodes 1 and 2 by means of retaining ring 8, which is in turn supported by a rod or the like (not shown) attached to the chamber enclosing the electrodes. It is to be noted that with the electrode arrangements of FIGS. 1 and 2, even D.C. or low frequency A.C. current may be employed, since there is no need for invoking dielectric displacement current to aid in generating a uniform plasma at the surface of the dielectric substrate. Furthermore, there is no need for masking to overcome end effects, which is used when the plasma current is transverse to the surface to be treated.

Figure 3:
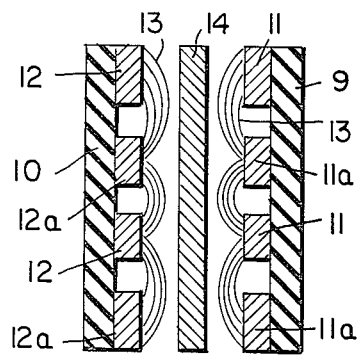

When it is desired to treat a large article, such as a sheet having a length and width of significant proportions, then the use of a single pair of electrode structures, as in FIGS. 1 and 2, is likely to give rise to plasma instability. In such cases, the embodiment shown in FIG. 3 may be used to generate a uniform plasma of large area. In FIG. 3, a pair of dielectrics 9, 10 each carry electrodes of positive 11, 12 and negative 11$a$, 12$a$ (instantaneous) polarity to generate an electrode discharge plasma having a flow of plasma current indicated by lines 13 of constant plasma current. A wide substrate 14, shown in cross-section transverse to the length direction, is bathed on both sides by the plasma, either while moving through or suspended between the electrodes. Either A.C. or D.C. current may be used. The distance between opposed electrodes of the same polarity on opposed dielectrics 9 and 10 is held to a minimum so that there is suitable clearance between the substrate 14 and the electrodes 11, 12 and yet close contact of the substrate with the plasma. The distance between adjacent electrodes of opposite polarity on the same dielectric 9 or 10 is small enough so that stable plasmas are generated between the adjacent electrodes of opposite polarity. The gap between adjacent electrodes on dielectric 9 or 10 may be filled with solid dielectric, if desired, to minimize current flow between the edges of the electrode strips. Some nonuniformity of treatment along the length direction of the substrate 14 may occur due to the current density geometry of the extended plasma sheets. This non-uniformity of treatment, of course, disappears in the case of a substrate moving continuously in the length direction. Uniform treatment can also be accomplished by oscillating either the substrate 14 or the electrodes along the length direction.

Figure 4:
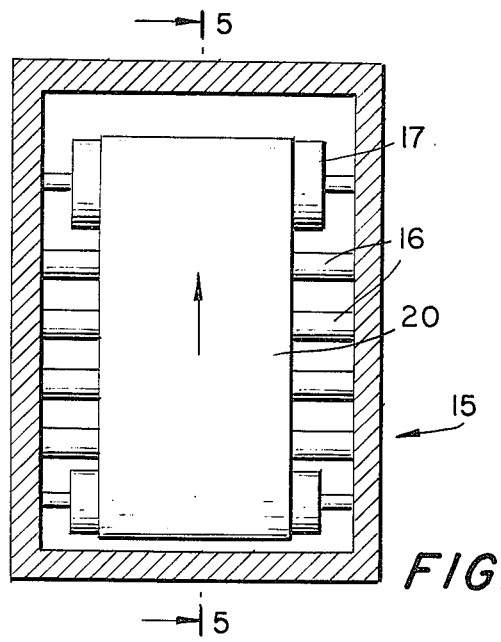
FIG. 4 is a vertical section of a treatment apparatus according to the invention.
Figure 5:
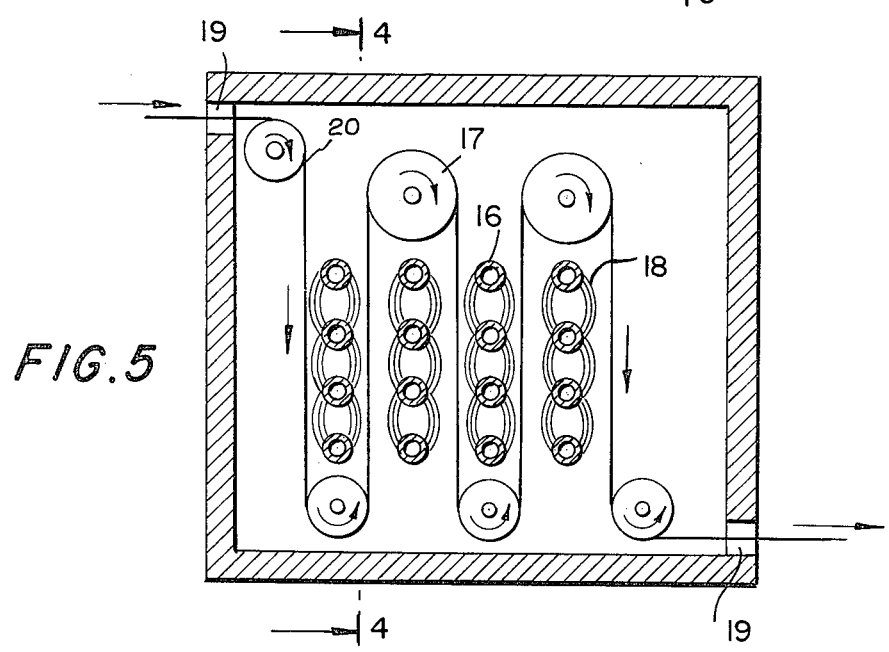
FIG. 5 is a view along lines 5—5 of FIG. 4.

As a further means of obtaining uniformity of treatment, it is desirable to cool the electrodes during the glow discharge, and while the flat electrodes of FIG. 3 may be cooled by any known cooling technique, such as cooled heat sinks, liquid cooled tracer tubing, cooling panels, etc., cooling of the electrodes is facilitated by the use of a tubular electrode, and FIGS. 4 and 5 show a suitable apparatus using a tubular electrode design.

FIGS. 4 and 5 show a chamber 15 having therein a series of parallel rows of horizontally extending tubular electrodes 16 and rollers 17. A substrate 20 to be treated enters and leaves the chamber 15 through seals 19 and passes over the rollers 17 between rows of electrodes 16 in the direction shown by the arrows. Substrate 20 may be pulled through the chamber 15 by an external feed apparatus (not shown) or one or more of the rollers may be motor driven. Electrodes 16 are cooled by passing a cooling liquid, such as water, through the electrodes. Each electrode can be connected to a source of coolant or one or more headers may be used. The electrodes 16 are connected to the source of coolant by any suitable means, such as extending the ends of electrodes 16 through the walls of chamber 15 and connecting one set of ends via tubing to a source of liquid coolant and the other set of ends to a reservoir, or the like, to enable the coolant to flow continuously.

The electrodes 16 are electrically connected to a power source (not shown) so that adjacent electrodes in each vertical row are of opposite polarity and adjacent electrodes 16 in each horizontal row are of the same polarity. In this way, the plasma will flow as shown in FIG. 5, where the lines 18 of constant plasma current are schematically illustrated.

It is possible to operate with a very small distance between adjacent electrodes 16 of opposite polarity in each vertical row. The gap may indeed be smaller than the cathode fall distance, this distance being inversely proportional to the discharge gas pressure. In such a circumstance, the maximum current density at the electrode surfaces for a particular operating current can be found empirically. For reasons of economy of electrode material, however, it is more desirable to have this spacing as large as possible, consistent with the establishment of stable discharge plasmas. Also for reasons of economy and establishment of glowing plasma over the entire surface of the electrodes, the diameter of the electrode should be small enough so that the plasma extends over the largest electrode surface without the occurrence of arcing. The same considerations apply for the flat electrodes of FIG. 3.

The embodiment of FIGS. 4 and 5 treats both surfaces of a moving web and makes use of the total plasma generating capability of the electrodes. Maximum use of available volume for plasma treatment in an enclosing vessel is another feature of this arrangement. Since available volume, particularly in industrial vacuum vessels, is a high cost element of the equipment, maximum use of this volume is an important economic aspect of this plasma treating arrangement.

Under certain circumstances, it may be desired to treat only one surface of a moving web. This is particularly true in regard to adhesion applications for plastic films. In such a case, the embodiment of FIGS. 4 and 5 can be modified to include only one vertical row of electrodes, the web making only one pass over the electrodes before leaving the chamber, or by disabling the second and fourth vertical rows of electrodes, counting from the left.

Figure 6:
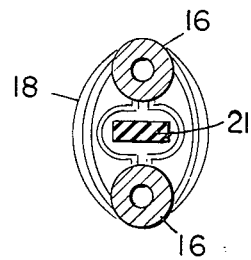
FIGS. 6 and 7 show modified electrode structures.
Figure 7:
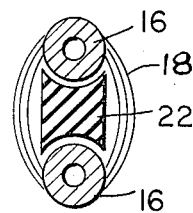

When cylindrical electrodes are used, there is some loss of efficiency due to the generation of considerable plasma along the gap between adjacent electrodes in a vertical row, rather than close to the web surface. Although active species generated in this region reach the web surface by diffusion, there is considerable loss involved. In order to overcome this loss in efficiency, dielectric barriers 21 (FIG. 6) or 22 (FIG. 7) may be placed between electrodes 16 of opposite polarity to force the current paths 18 closer to the surface of the substrate web.

Figure 8:
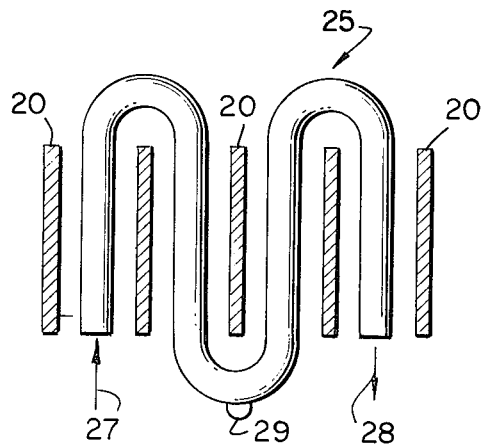
FIGS. 8 and 9 are plan views of alternative electrode structures.
Figure 9:
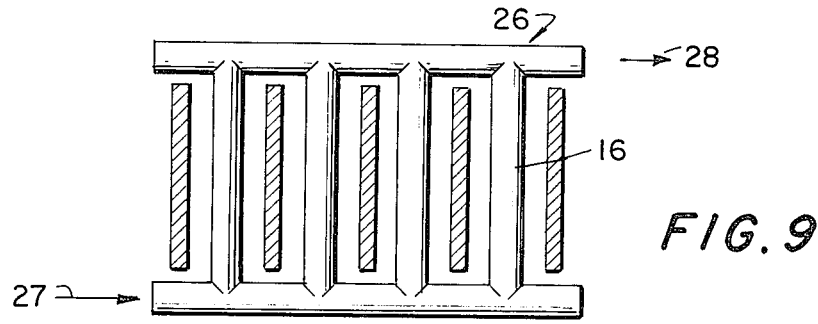

To minimize the number of electrical power connections and coolant flow connections to an electrode array when cylindrical or other hollow electrodes are used, and for construction simplicity, it is desirable to replace the horizontal rows of electrodes 16 with serpentine electrode structures or ladder type structures, as shown in FIGS. 8 and 9, respectively. Thus, FIGS. 4 and 5 show an electrode configuration of four horizontal rows of electrodes, each horizontal row containing four electrodes 16. Each such horizontal row may be replaced by an electrode structure 25 (FIG. 8) or 26 (FIG. 9), each structure having four straight sections to provide electrodes 16. FIGS. 8 and 9 show structures 25 and 26 in plan, and thus substrate 20, seen in section, moves perpendicular to the plane of the drawing. The arrows 27 and 28 show the points of coolant entry and exit, respectively and connector 29 can be used to connect each structure, and hence all electrodes 16 thereof, to a power source.

To further reduce the number of connections, vertical tubes (not shown) can be connected to electrode structures 25 or 26 of the same polarity to provide a path for coolant from one structure 25 or 26 of the one polarity to all other structures of the same polarity. The several horizontal electrode structures 25 or 26 of the same polarity can be electrically connected together, thereby requiring only one external electrical connection 29.

Figure 10:
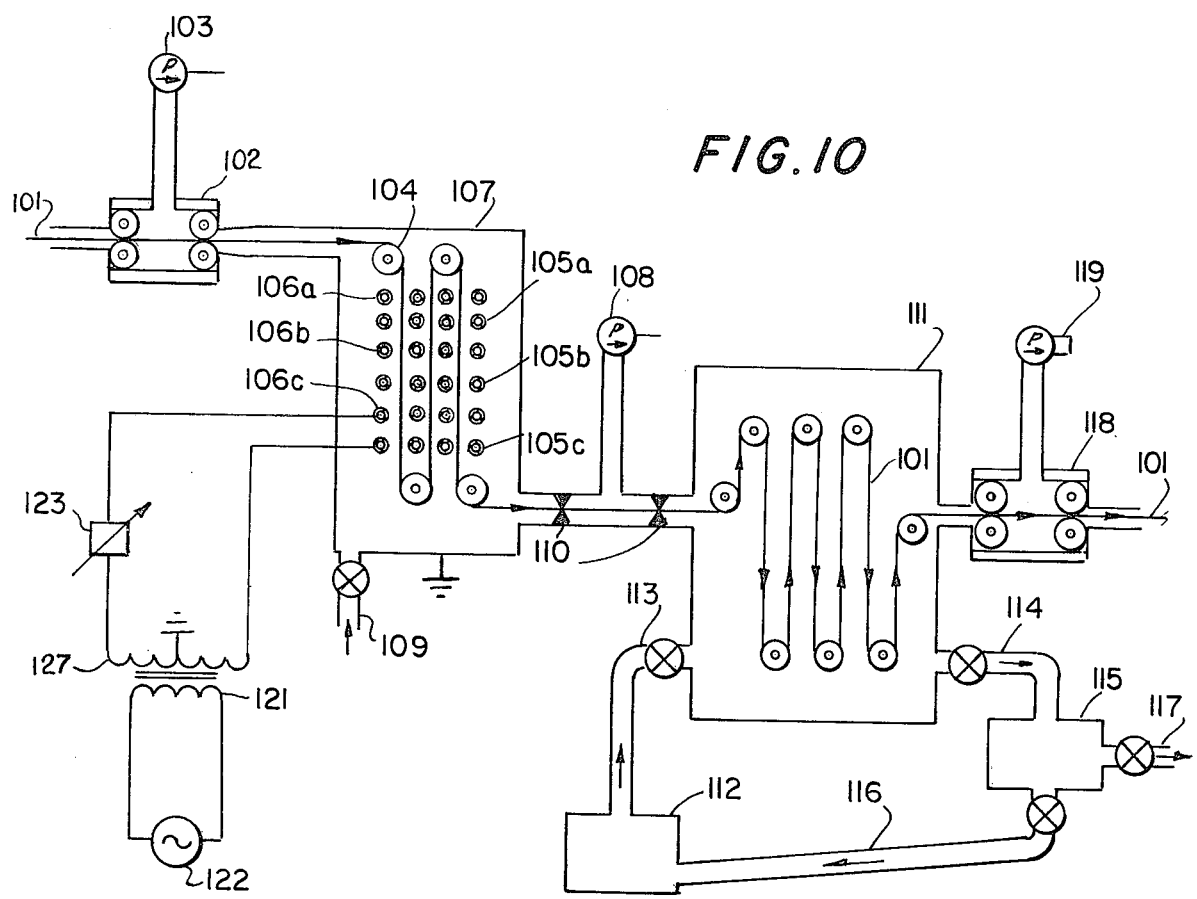
FIG. 10 is a schematic diagram showing the use of the apparatus of the present invention in an electrical discharge plasma treatment.
Figure 12:
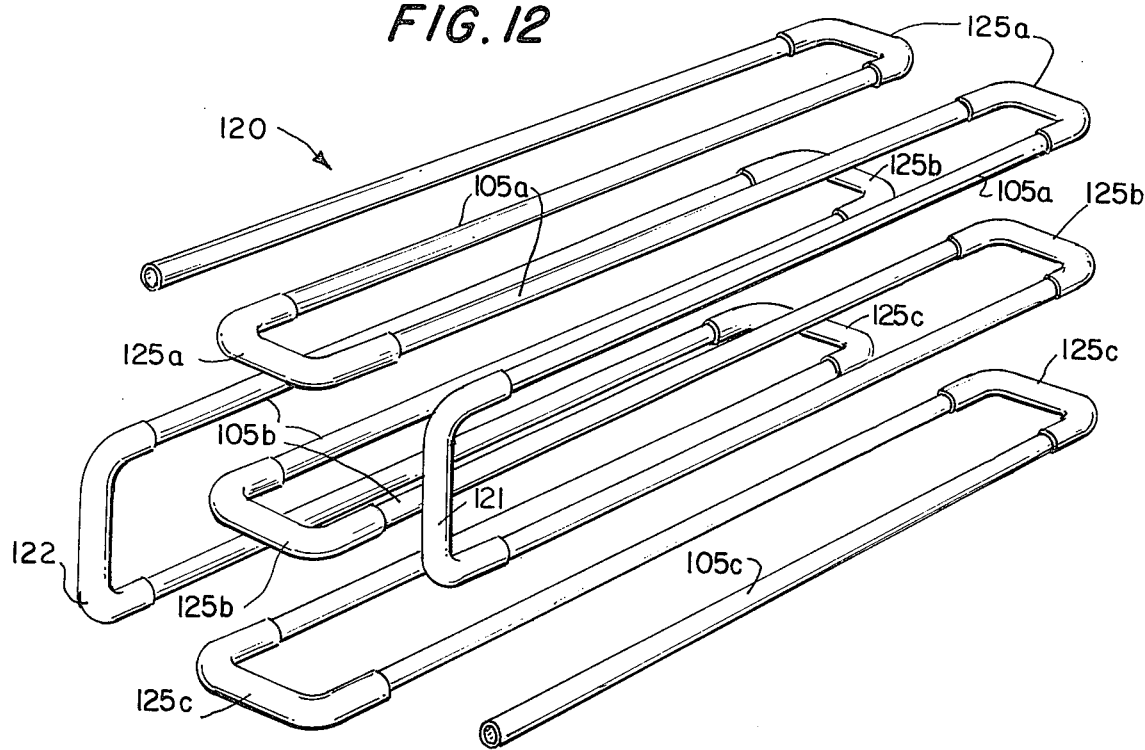
FIG. 12 is a perspective view of an electrode structure according to the present invention.

For purposes of treatment of a long substrate of substantial width, say a bolt of natural or synthetic textile material, it is desirable to optimize as many features as possible so as to provide uniform treatment in an economical manner suitable for use in industry. Such an embodiment is shown in FIGS. 10–13, which illustrate a continuous treatment apparatus embodying the electrode structure of the invention. In FIG. 10, the substrate 101 passes through an air lock 102 from which air is evacuated by means of vacuum pump 103. After leaving the air lock 102, the substrate 101 enters chamber 107 and is driven by rollers 104 through the rows of electrodes 105a to 105c and 106a to 106c in the direction shown by the arrows. The electrodes consist of one set of horizontal rows of parallel metal tubes 105a, 105b, 105c of one polarity and another set of horizontal rows of parallel metal tubes 106a, 106b, 106c of opposite polarity. As more clearly seen in FIGS. 11 and 12, electrodes 105a, 105b and 105c and electrodes 106a, 106b and 106c are a pair of continuous electrode structures. These electrode structures will be discussed in more detail below. The desired vacuum is pulled by vacuum pump 108 and the desired gas admitted to chamber 107 via gas inlet 109. Seals 110 allows the substrate 101 to pass from chamber 107 to chamber 111 without contacting the air.

An electrical discharge plasma is generated in chamber 107 by connecting electrodes 105a–105c and 106a–106c to opposite ends of a center-tapped transformer secondary winding 127, the center of which is grounded, as is chamber 107 itself. By suitable choice of windings 127 and 121, and AC power source 122, the desired potential difference can be applied across electrodes 105a–105c and 106a–106c. An adjustable impedance 123 is provided to stabilize the discharge.

The electrodes are cooled in a manner discussed in detail below, the connections of the electrodes to the coolant and the drive motors for moving the substrate 101 being omitted for simplicity.

The thus treated substrate, having been bathed on both sides with plasma, enters chamber 111 for further desired treatment. In the case illustrated, substrate 101 is a polyester fabric to which is grafted polyacrylic acid to render the fabric hydrophillic and to enable the fabric to be easily dyed, bonded with adhesives and made retentive for metal ions. To this end, acrylic acid is fed into chamber 111 from reservoir 112 via inlet 113, and excess acrylic acid is recycled from acrylic acid outlet 114 via recycler 115 and conduit 116, excess acrylic acid being removed via exhaust 117. Coleman U.S. Pat. No. 3,600,122 discloses such a process and is incorporated herein by reference thereto.

Substrate 101 leaves chamber 111 and passes through airlock 118, which is maintained under vacuum by pump 119. Substrate 101 has now been fully treated and is sent to storage.

Clearly, in lieu of the treatment described above, any electrical discharge plasma treatment may be employed, the electrode apparatus of the present invention being applicable to any such process.

FIG. 11 shows the electrode structure in more detail. As can be seen, the electrode structure consists of a pair of continuous welded electrodes consisting of the straight tubes 105a–105c and 106a–106c connected together by means of horizontal and vertical connectors. Thus, with reference to FIG. 11, the electrodes 105a are connected together in series by the three U-shaped connectors 125a, and the electrodes 105b and 105c are similarly connected by the U-shaped connectors 125b and 125c, respectively. The U-shaped connector 121 connects the electrodes 105a to the electrodes 105b, and the U-shaped connector 122 connects the electrodes 105b to the electrodes 105c. The electrode structure thus provides a continuous electrical path from one end 123 to the other end 124 of the unitary electrode structure 120. The other electrode structure 130 is made in a similar fashion utilizing the horizontal U-shaped connectors 126a to 126c and the vertical U-shaped connectors 131 and 132.

Coolant for electrode structure 120 may be pumped from the end 123 through the electrodes 105c, 105b and 105a to the end 124. Likewise, coolant for electrode structure 130 may be pumped from the lower end (hidden behind substrate 101 in FIG. 10) to the upper end 134 (FIG. 11) through the electrodes 106c, 106b and 106a.

As seen in FIG. 11, spacers 150 made of insulating material, such as polyethylene or other plastic, may be used to support the electrodes 105a to 105c and 106a to 106c. Only one pair of spacers 150 is shown, the others being omitted for simplicity.

The electrodes 105a to 105c and 106a to 106c are made of metal, such as aluminum, copper, steel or any other conductive metal, preferably aluminum. The coolant may be any coolant operable to remove heat from the metal tubes, but preferably is water due to its low cost and high heat capacity.

The U-shaped connectors 121, 122, etc. are desirably made of the same metal as the electrodes 105a to 105c and 106a to 106c, but this is not critical. The function of the U-shaped connectors is merely to act as electrical connectors and coolant conduits, and any material suitable for this purpose may be employed.

As a practical matter, U-shaped connectors 121, 122, etc. are welded to the electrodes 105a to 105c and 106a to 106c, but a single structure bent to the desired shape from one tube would be preferred.

FIG. 13 diagrammatically shows the relationship of the plasma to the moving substrate. As can be seen, the plasma 160 generated by the pairs of adjacent electrodes of opposite polarity, such as 106a and 105a is generally parallel to the path of movement of the substrate 101. In the preferred embodiment illustrated in FIG. 13, both sides of the substrate 101 are bathed in plasma 160. Most importantly, the plasma 160 does not pass through the substrate 101, snce the substrate 101 moves tangentially across electrodes of opposite polarity in contrast to prior art systems where the substrate moved between electrodes of opposite polarity, and in such cases the plasma passed through the substrate.

The electrode structures 120 and 130 are shown as having three horizontal rows, four electrodes in each row, but clearly more or less rows and/or more or less electrodes per row will be employed, depending upon the particular treatment requirements.

While the preferred embodiment of the electrode structures is illustrated in FIGS. 10–13 in terms of a pair of electrode structures, depending upon the length of the path of travel of the substrate, it may be desirable in some instances to use more than one pair. In addition, while the preferred embodiment of the electrode structure illustrated in FIGS. 10–13 shows the U-shaped connectors 121, 122, 125a to 125c, etc. as providing both electrical connection and a path for coolant to flow from electrode to electrode, it is possible to make these U-shaped connectors out of electric insulating material so that they perform only one function, namely that of providing a path for coolant. In such a case, the electrodes 105a–105c and 106a–106c would be electrically connected in series by means of electrical connectors (not shown), such as copper bars and the like.

To simplify FIGS. 10–13, the connections between the source of coolant and the electrodes are not shown. Such connections are readily made by passing the two ends of each electrode structure 120 and 130 through the ends of the chamber 107 by any suitable conventional sealing means and then connecting these ends to the source of coolant. The electrical connection between the electrode structures 120 and 130 to the source of AC power 122 can readily be made by passing electrical leads through the end or side walls of chamber 107 in any conventional manner.

In all of the embodiments shown, the plasma is generated between electrodes of opposite polarity, and in a suitable range of operating distances between electrodes of opposite polarity may be from ⅛ inch to approximately 10 inches and is preferably approximately 1 inch. The range of distance between electrodes of the same polarity is from ¼ inch to 6 inches, and is preferably approximately 2 inches. These distances are measured from the outer surfaces of the electrodes.

The electrodes themselves may be of any material suitable for generating an electrical discharge, such as glass or metal. Metal electrodes are preferred, and aluminum, copper, steel, brass, etc. or chrome- or other plated electrodes may be used.

The electrical discharge occurs in a gas to form the electrical discharge plasma. Depending upon the desired treatment, the gas may be any gas that will partially dissociate and support the electrical discharge plasma. Suitable gases include air, oxygen, hydrogen, nitrogen, the inert gases of Group VIII of the Periodic Table, and mixtures thereof.

The electrical discharge may be conducted at any desired reduced pressure, and a suitable range of from about 0.001 Torr to about 100 Torr, preferably about 0.1 Torr to about 10 Torr, will generally be most satisfactory.

The electrical discharge is preferably carried out in a gas at ambient temperature, although lower or elevated temperatures may be used.

The electrical discharge is effected by imposing the desired voltage on the electrodes, of the order of 150 to 1000 volts. It is often desirable to include an adjustable impedance in series with the source current to stabilize the plasma, the precise range of adjustability depending upon the system involved.

What is claimed is:

1. A method of treating a moving substrate with an electrical discharge plasma, which comprises passing said substrate along a plurality of different paths of travel through an electrode means comprising at least two electrode structures, each electrode structure comprising at least one row of a plurality of elongated, tubular electrodes, the rows of one electrode structure alternating with the rows of the other electrode structure to form a stacked array of rows transverse to the said paths of travel of said substrate; maintaining the electrode structures at opposite polarity; the tubular electrodes being arranged to provide a plurality of different paths of travel of said substrate through said stacked array; each said path being substantially tangent to a plurality of said tubular electrodes arranged alternately of one polarity and then the opposite polarity; establishing an electrical plasma discharge such that the flow of plasma current is at least substantially parallel to a major surface of the substrate during each said path of travel of said substrate, said tubular electrodes being so arranged as to be operable to generate an electrical plasma discharge between adjacent tubular electrodes of opposite polarity; and cooling the tubular electrodes during the electrical discharge by flowing coolant therethrough.

2. An electrode apparatus for generating electrical discharge plasma for treatment of a moving substrate, comprising at least two electrodes structures of opposite polarity, each electrode structure comprising at least on row of a plurality of elongated, tubular electrodes, the rows of one electrode structure alternating with the rows of the other electrode structure to form a stacked array of rows transverse to the path of travel of said substrate; the tubular electrodes being arranged to provide a plurality of different paths of travel of said substrate through said stacked array; each said path being substantially tangent to a plurality of said tubular electrodes arranged alternately of one polarity and then the opposite polarity; said tubular electrodes being so arranged as to be operable to generate an electrical plasma discharge between adjacent tubular electrodes of opposite polarity such that the flow of plasma current is at least substantially parallel to a major surface of the substrate during each said path of travel of said substrate; and conduit means for providing a path for coolant to flow through the tubular electrodes of an electrode structure.

3. Apparatus according to claim 2, wherein the alernating rows are parallel and all the tubular electrodes are parallel to one another.

4. Apparatus according to claim 3, wherein the path of travel of the substrate is perpendicular to said rows, adjacent paths being in opposite directions.

5. Apparatus according to claim 3, wherein said tubular electrodes are so arranged as to be operable to generate an electrical discharge plasma between adjacent tubular electrodes of opposite polarity such that the flow of plasma current is at least substantially parallel to both sides of said substrate as it moves along each of said paths.

6. Apparatus according to claim 2, wherein the tubular electrodes are circular.

7. Apparatus according to claim 2, wherein the tubular electrodes have a radius of curvature of at least ¼-inch.

8. Apparatus according to claim 2, wherein adjacent tubular electrodes of opposite polarity are spaced apart from ⅛ to 10 inches, surface to surface, and adjacent tubular electrodes of the same polarity are spaced apart from ¼ to 6 inches.

9. Apparatus according to claim 2, wherein said electrodes are metal.

* * * * *